United States Patent
Suwabe et al.

[11] Patent Number: 6,033,538
[45] Date of Patent: Mar. 7, 2000

[54] MAGNETO-OPTICAL RECORDING MEDIUM PRODUCTION METHOD

[75] Inventors: Masatsugu Suwabe; Yoshihito Fukushima; Yoshihiro Muto, all of Miyagi, Japan

[73] Assignee: Sony Corporation, Tokoy, Japan

[21] Appl. No.: 08/961,158

[22] Filed: Oct. 30, 1997

[30] Foreign Application Priority Data

Oct. 31, 1996 [JP] Japan .............................. P08-290561

[51] Int. Cl.$^7$ .................................................. C23C 14/34
[52] U.S. Cl. .............................. 204/192.26; 204/192.12; 204/192.2; 204/192.25; 427/548
[58] Field of Search ................... 204/192.12, 192.26, 204/192.2, 192.25; 427/548

[56] References Cited

U.S. PATENT DOCUMENTS

| | | | |
|---|---|---|---|
| 5,106,703 | 4/1992 | Carcia ..................................... 428/635 |
| 5,441,804 | 8/1995 | Akitake et al. .......................... 428/336 |
| 5,585,200 | 12/1996 | Sato et al. ............................... 428/694 |
| 5,599,580 | 2/1997 | Futamoto et al. ....................... 427/130 |
| 5,603,814 | 2/1997 | Tsutsumi et al. .................. 204/192.22 |
| 5,648,161 | 7/1997 | Miyazawa et al. ..................... 428/332 |
| 5,757,736 | 5/1998 | Onagi ........................................ 369/13 |
| 5,824,427 | 10/1998 | Kobayashi et al. ..................... 428/694 |
| 5,838,645 | 11/1998 | Hirokane et al. .......................... 369/13 |
| 5,876,807 | 3/1999 | Muto ....................................... 427/548 |

*Primary Examiner*—Yogendra Gupta
*Assistant Examiner*—Dawn L. Garrett
*Attorney, Agent, or Firm*—Hill & Simpson

[57] ABSTRACT

In a magneto-optical recording medium including a first magnetic layer which is magnetized in a predetermined direction according to a data signal and a second magnetic layer which is magnetically connected to the first magnetic layer by exchange interaction, so that a boundary magnetic wall can exist between the first magnetic layer and the second magnetic layer, the present invention increases stability of the boundary magnetic wall formed between the first magnetic layer and the second magnetic layer and to enhance a reproduction durability as well as durability against repeated recording.

The first magnetic layer and the second magnetic layer are formed by sputtering. At least one of the magnetic layers composing the first magnetic layer and positioned adjacent to the second magnetic layer is formed with a sputter gas pressure greater than the sputter gas pressure applied when forming a magnetic layer composing the second magnetic layer and positioned adjacent to the first magnetic layer.

11 Claims, 3 Drawing Sheets ated during a recording and initialized to a particular direction upon completion of the recording. The magnetic layer which is temporarily demagnetized is called a switch layer which is for controlling a magnetic connection state between the recording layer and the initialization layer.
MAGNETO-OPTICAL RECORDING MEDIUM PRODUCTION METHOD

BACKGROUND OF THE INVENTION

1. Field of the Invention

The present invention relates to a method for producing a magneto-optical recording medium made from a plurality of magnetic layers connected to one another by exchange interaction between which layers a boundary magnetic domain wall can exist around a room temperature.

2. Description of the Prior Art

In the field of magneto-optical recording and reproduction, a request for a higher transfer rate has been raised. In order to answer this request, various techniques have been developed and are being implemented in practice. Among them, there can be named a technique of photo-intensity modulation direct overwriting.

When recording data on a magneto-optical recording medium with a photo-intensity modulation method, normally, a weak DC magnetic field is applied to the magneto-optical recording medium and a laser beam is radiated while modulating the beam depending on the presence/absence of a signal. Consequently, when re-recording a data on a already recorded area by using a conventional magneto-optical recording/reproduction apparatus of the photo-intensity modulation method, it is necessary to erase the recorded area prior to the re-recording. That is, it is impossible to directly overwrite on the already recorded area.

Thus, most of the magneto-optical recording/reproduction apparatuses which have been implemented in practice require an erase operation prior to recording a new data. This means that the magneto-optical recording medium should rotate by at least two turns for recording a signal, which has prevented to provide a high transfer rate.

In order to solve such a problem, there has been designed the photo-intensity modulation direct overwriting technique which employs the photo-intensity modulation method and enables direct overwriting.

For example, Japanese Patent Laid-Open Sho 62-175948 discloses a photo-intensity modulation direct overwriting method which employs a magneto-optical recording medium made from two magnetic layers layered having different magnetic characteristics and layered so as to be connected to each other by exchange interaction; and a magneto-optical recording and reproduction apparatus including: an optical system capable of radiating a beam controlled to two values, i.e., a high level and a low level, during a recording; a recording magnetic field generating apparatus which is used in an ordinary magneto-optical recording and reproducing apparatus; and a so-called initialization magnet, i.e., an external magnetic field generating apparatus capable of inverting only one of the two layers at a room temperature.

However, in order to realize a photo-intensity modulation direct overwriting by using this technique, the initialization magnet should an initialization magnetic field in the order of several kOe, which is a problem in designing the magneto-optical recording and reproduction apparatus.

In order to cope with this, reduction of the initialization magnetic field has been tried such as in a method disclosed in Japanese Patent Laid-Open Hei 1-185853. Such efforts have reduced the initialization magnetic field in the order of 2 kOe, which is still a significantly great value if compared to the recording magnetic field in the order of 300 Oe. This initialization magnetic field is still a problem and this method is not yet implemented in practical use.

On the other hand, separately from the examination for reduction of the initialization magnetic field, a research has been made to enable the photo-intensity modulation direct overwriting without using any initialization magnetic field. As a result, there has been designed a magneto-optical recording medium disclosed in Japanese Patent Sho 63-268103 and further in Japanese Patent Hei 3-219449.

This magneto-optical recording medium basically consists of the magneto-optical recording medium disclosed in Japanese Patent Laid-Open Sho 62-175948 with addition of a magnetic layer which serves as an initialization magnet by the exchange interaction force. This magnetic layer is prepared in such a manner that its magnetization will not change during a recording and is called an initialization layer. That is, this magneto-optical recording medium enables photo-intensity modulation direct overwriting by providing the initialization layer whose magnetization direction is not changed during a recording.

The magneto-optical recording medium capable of carrying out the photo-intensity modulation direct overwriting by means of the initialization layer includes at least: a magnetic layer which is magnetized according to a recording signal; a magnetic layer whose magnetization direction is temporarily changed according to a recording signal during a recording; a magnetic layer which is temporarily demagnetized during a recording; and a initialization layer whose magnetization direction is not changed during a recording;

Here, the magnetic layer which is magnetized according to a recording signal is called a memory layer which is a layer for retaining recording magnetic domain. The magnetic layer whose magnetization direction is temporarily changed according to a recording signal during a recording is called a recording layer which is magnetically inverted according to a recording signal during a recording and initialized to a particular direction upon completion of the recording. The magnetic layer which is temporarily demagnetized is called a switch layer which is for controlling a magnetic connection state between the recording layer and the initialization layer.

In such a magneto-optical recording medium, magnetization of the memory layer is inverted by utilizing a temperature dependency of the energy, i.e., which is greater: the boundary magnetic wall energy between the memory layer and the recording layer or the coercive force of the memory layer.

In the aforementioned magneto-optical recording medium capable of the photo-intensity modulation direct overwriting by means of the initialization layer, the magnetization direction of the memory layer and that of the recording layer are parallel or anti-parallel to each other according to a recording signal. Consequently, it is necessary that a boundary magnetic wall exist with a stability between the memory layer and the recording layer around a room temperature.

That is, in a magneto-optical recording medium capable of the photo-intensity modulation direction overwriting, it is necessary that the recording domain formed in the memory layer be retained with a sufficient stability under the existence of the boundary magnetic wall between the memory layer and the recording layer. However, it is difficult to retain such a boundary magnetic wall with a stability. Consequently, in the magneto-optical recording medium capable of carrying out the photo-intensity modulation direction overwriting, it is difficult to assure a reproduction stability compared to the conventional magneto-optical recording medium having no such boundary magnetic wall.

Moreover, in the magneto-optical recording medium capable of carrying out the photo-intensity modulation direct overwriting, the demagnetization process utilizes the temperature dependency of the relationship between the effective magnetic field by the boundary magnetic wall and the coercive force of the memory layer. However, this temperature dependency is susceptible to a thermal damage by repeated recording processes. Consequently, in the magneto-optical recording medium capable of carrying out the photo-intensity modulation direct overwriting, it is difficult to suppress the demagnetization sensitivity change after the thermal damage caused by repeated recording processes, compared to the conventional magneto-optical recording medium in which the magnetization sensitivity is almost determined by the Curie temperature.

As has thus far been described, the magneto-optical recording medium capable of carrying out the photo-intensity modulation direct overwriting has a problem of stability of the boundary magnetic wall formed between the memory layer and the recording layer, and there is an object to achieve a stability of the boundary magnetic wall.

Such an object applies not only to the magneto-optical recording medium capable of Carrying out the photo-intensity modulation direct overwriting, but also to a magneto-optical recording medium in general having a plurality of magnetic layers which are magnetically connected to one another by the exchange interaction effect so that a boundary magnetic wall can be exist between the magnetic layers around a room temperature.

SUMMARY OF THE INVENTION

The present invention has been developed in view of the aforementioned situations and provides a method for producing a magneto-optical recording medium in which film forming conditions of a particular magnetic layer are set different from the conditions of the other magnetic layers, so as to improve stability of the boundary magnetic wall around a room temperature as well as to enhance durability against repeated recording processes.

In order to achieve the aforementioned object, the inventor Carried out various examinations and has found that by forming a plurality of magnetic layers by sputtering while controlling a gas pressure for the sputtering, it is possible to obtain stable boundary magnetic walls between magnetic layers, and has reached the present invention.

That is, a method for producing a magneto-optical recording medium according to the present invention includes steps of: forming a first magnetic layer made from at least one magnetic film which is magnetized in a predetermined direction according to a data signal; and forming a second magnetic layer made from at least one magnetic film which is magnetically connected with the first magnetic field by an exchange interaction, so that a boundary magnetic wall can exist between the first magnetic layer and the second magnetic layer around a room temperature, wherein the first magnetic layer and the second magnetic layers are formed by way of sputtering; and at least a magnetic film of the magnetic films forming the first magnetic layer which is adjacent to the second magnetic layer is formed with a higher sputter gas pressure than a sputter gas pressure applied when forming a magnetic film of the magnetic films forming the second magnetic layer which is adjacent to the first magnetic layer.

In general, when a sputter gas pressure is increased in forming a magnetic film, the product MsHc of the saturation magnetization Ms with the coercive force Hc is increased. In the present invention, as has been described above, at least a magnetic film of the magnetic films composing the first magnetic layer which is adjacent to the second magnetic layer is formed with a higher sputter gas pressure than a sputter gas pressure applied when forming a magnetic film of the magnetic films composing the second magnetic layer which is adjacent to the first magnetic layer. This increases the product MsHc of the magnetic film composing the first magnetic layer. When the product MsHc of the magnetic film composing the first magnetic layer is increased, it becomes difficult for magnetic inversion to be generated in the first magnetic layer, and the boundary magnetic wall between the first magnetic layer and the second magnetic layer becomes stable.

DETAILED DESCRIPTION OF THE PREFERRED EMBODIMENTS

Figure 1:
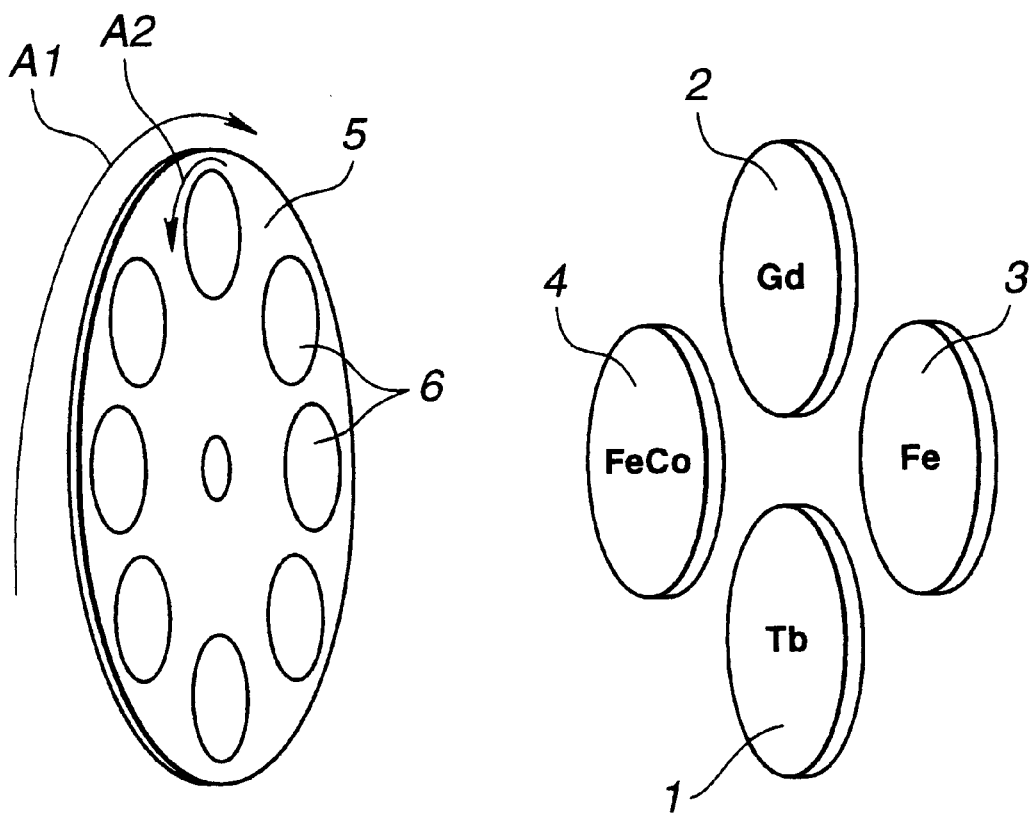
FIG. 1 is a perspective view schematically showing an example of a sputtering apparatus.

Description will now be directed to an embodiment of the present invention with reference to the attached drawings. It should be noted that the present invention is not limited to the following embodiment but can be modified in various ways within the scope of the invention.

The embodiment will be explained with an example of magneto-optical disk capable of carrying out the photo-intensity modulation direct overwriting without requiring any initialization magnetic field.

As disclosed in Japanese patent Laid-Open Sho 63-268103, such a magneto-optical disk can be realized by forming at least for magnetic layers. That is, the magneto-optical disk capable of Carrying out the photo-intensity modulation direct overwriting can be realizing by forming on a disk substrate: a memory layer which is magnetized according to a recording signal during a recording; a recording layer whose magnetization direction is temporarily changed according to a recording signal during a recording; a switch layer which is temporarily demagnetized during a recording; and an initialization layer which does not change is magnetization direction during a recording.

However, in order to realize practical recording/reproduction characteristics, it is preferable to provide a magnetic layer which is called a reproduction layer in the nearest position to the disk substrate. The reproduction layer is for obtaining a greater reproduction output and is made from a magnetic material which enables to obtain a greater Kerr rotational angle than the memory layer such as a layer made from GdFe. Moreover, if consideration is taken on the operation stability and the film margin size, it is preferable to provide a magnetic layer which is called an intermediate layer between the memory layer and the recording layer in order to control the magnetic connection state obtained by the exchange interaction between the memory layer and the recording layer.

Consequently, in the magneto-optical disk capable of carrying out the photo-intensity modulation direct overwriting, it is preferable to form provide six layers on the disk substrate consisting of the reproduction layer, the memory layer, the intermediate layer, the recording layer, the switch layer, and the initialization layer. Hereinbelow, an explanation will be given on the example of the magneto-optical disk having such six magnetic layers. In practice, in order to improve the optical characteristic and the thermal characteristic of the magneto-optical disk, a dielectric layer and a metal layer are also formed.

In the magneto-optical disk having the aforementioned 6-layered configuration, the memory layer should satisfy a condition defined by Formula (1) below, in order to retain a recording magnetic domain at a room temperature and at a temperature increased when radiated by a reproduction laser beam.

$$Hc(Mem) \cdot Ms(Mem) \cdot h(Mem) - \sigma w(Int) > 0 \qquad (1)$$

Moreover, the memory layer should satisfy another condition defined by Formula (2) below, so that at a temperature increased by radiation of an erase laser beam, a recording magnetic domain of the currently recorded portion is erased and magnetization of the recording layer is transferred.

$$Hc(Mem) \cdot Ms(Mem) \cdot h(Mem) - \sigma w(Int) < 0 \qquad (2)$$

In the above formulae, Hc(Mem) represents a coercive force of the memory layer; Ms(Mem), a saturation magnetization of the memory layer; h(Mem), a film thickness of the memory layer; and σw(Int), boundary magnetic wall energy in the boundary between the memory layer and the intermediate layer.

As can be seen from Formula (1), in order to improve the stability of the recording magnetic domain, it is necessary whether to increase the Hc(Mem)·Ms(Mem)·h(Mem) or to reduce the σw(Int). The value of σw(Int) can be reduced by adjusting the composition and the film thickness of the intermediate layer. However, as can be seen from the Formula (2), if the value of σw(Int) is made too small, the magnetization of the recording layer cannot be transferred to the memory layer when an erase laser beam is applied. Consequently, the value σw(Int) cannot be made so small.

Therefore, in order to enhance the stability of the recording magnetic domain, it is necessary to increase the Hc(Mem)·Ms(Mem)·h(Mem). Because the h(Mem) cannot be changed because of the optical characteristics, it is necessary to increase the Hc(Mem)·Ns(Mem). That is, in order to improve the stability of the recording magnetic domain, it is necessary to increase the product MsHs of the memory layer.

Such a magnetic layer is normally formed by sputtering. In the embodiment which will be explained later, the magnetic layers on the disk substrate are formed successively without breaking a vacuum by using a magnetron sputter apparatus as shown in FIG. 1 by way of DC magnetron sputter using argon as a sputter gas.

Here, a set of a Tb target 1, a Gd target 2, a Fe target 3, and a $Fe_{20}Co_{80}$ target 4 is placed in a film forming chamber, and the composition of each magnetic layer is adjusted by controlling power applied to these targets 1, 2, 3, and 4. When forming each of the magnetic layers, in order to suppress irregularities of the film thickness and composition, a disk substrate is set on a substrate holder 6 attached to a pallet 5 of a circular metal plate, and the pallet with the substrate holder 6 is rotated around the center of the pallet 5 in the direction of arrow A1 in FIG. 1 while rotating the disk substrate on the substrate holder 6 around the center of the substrate holder 6 in the direction of arrow A2 in FIG. 1.

The product MsHc of the magnetic layer formed by such a sputtering apparatus is changed depending on the conditions of the film formation. There are two representative methods to change the product MsHc of the magnetic layer by changing the conditions of film formation by sputtering. One of them is to control a cycle of layering between a rare earth element and transition metal element so as to control the product of MsHc; and the other is to control the sputter gas pressure when forming a film so as to control the product of MsHc. The magnetron sputter apparatus as shown in FIG. 1 enables to employ any one of these two methods.

However, a magnetic layer which composes the magneto-optical disk has a thickness in the order of 10 nm. When forming such a thin film, irregularities are easily caused in the composition if the layering cycle is too late, and it is difficult to simultaneously obtain the optimal layering cycle from the viewpoint of the MsHc product and suppress composition irregularities within the film. Consequently, it is preferable to control the product MsHc of the magnetic film composing the magneto-optical disk by changing the sputter gas pressure during a film formation. Thus, the present embodiment controls the MsHc product of the magnetic film composing the magneto-optical disk by changing a sputter gas pressure during a film formation.

Description will now be directed to examples of stabilization of a recording magnetic domain by controlling the MsHc product by changing a sputter gas pressure during a film formation, with comparison to comparative examples.

EXAMPLE 1

Figure 2:
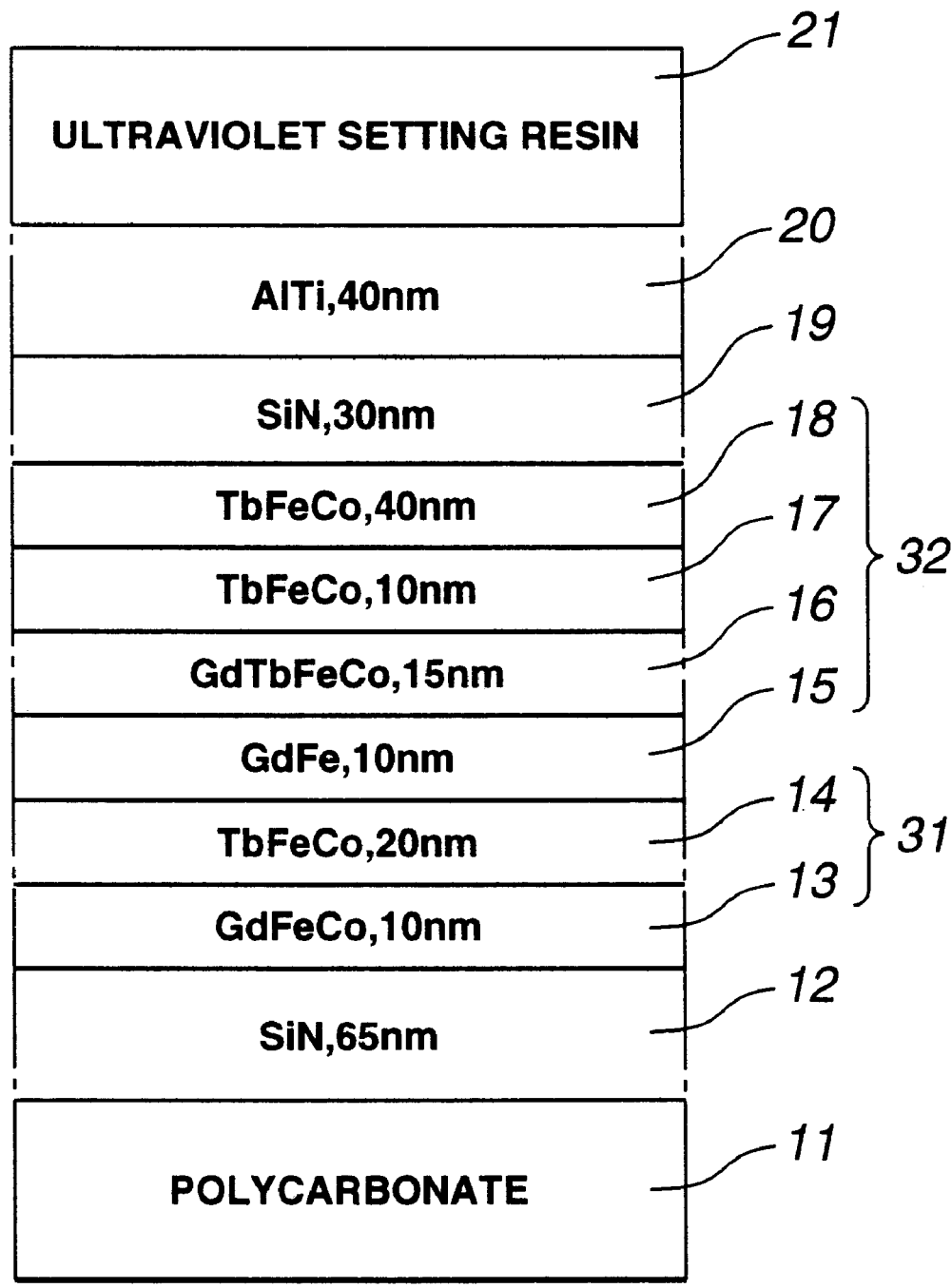
FIG. 2 shows a layered configuration of a magneto-optical disk produced according to the present invention.

FIG. 2 shows a configuration of a magneto-optical disk prepared according to a first example. This magneto-optical disk includes in a disk substrate 11 made from polycarbonate: a dielectric layer 12 made from a 65 nm film of SiN; a reproduction layer 13 made from a 10 nm film of GdFeCo; a memory layer 14 made from a no nm film of TbFeCo; an intermediate layer 15 made from a 10 nm film of GdFe; a recording layer 16 made from a 15 nm film of GdTbFeCo; a switch layer 17 made from a 10 nm film of TbFeCo; an initialization layer 18 made from a 40 nm film of TbFeCo; a dielectric layer 19 made from a 30 nm film of SiN; a metal layer 20 made form a 40 nm film of AlTi; and a protection layer 21 made from a ultraviolet setting resin.

According to this example, the disk substrate 11 made from polycarbonate is set on a sputtering apparatus as shown in FIG. 1 and each of the aforementioned layers is formed while rotating the pallet 5 and the substrate holder 6.

That is, firstly, the dielectric layer 12 of SiN is formed into a 54 nm film on the disk substrate 11 by the reaction RF sputter.

Next, the DC magnetron sputter is employed with a sputter gas pressure of 11 mTorr to cover the dielectric layer 12 with the reproduction layer 13 of 10 nm GdFeCo and the memory layer 14 of 20 nm TbFeCo which are successively formed.

Next, the sputter gas pressure is changed to 7 mTorr and the DC magnetron sputter is employed to cover the memory layer 14 with the intermediate layer 15 of 10 nm GdFe, the recording layer 16 of 15 nm GdTbFeCo, the switch layer 17 of 10 nm TbFeCo, and the initialization layer 18 of 40 nm TbFeCo which layers are successively and continuously formed.

Next, the reaction RF sputter is employed to cover the initialization layer 18 with the dielectric layer 19 of 30 nm SiN and then the DC magnetron sputter is employed to cover the dielectric layer 19 with the metal layer 20 of 40 nm AlTi.

When the aforementioned film formations are complete, the disk substrate 11 is taken out of the sputtering apparatus and the protection layer 21 is formed from an ultraviolet setting resin on the metal layer 20. Thus, the magneto-optical disk having the configuration of FIG. 2 is complete.

It should be noted that in the magneto-optical disk prepared according to this example, the reproduction layer 13 and the memory layer 14 serve as a first magnetic layer which is magnetized in a predetermined direction according to a data signal whereas the intermediate layer 15, the recording layer 16, the switch layer 17, and the initialization layer 18 serve as a second magnetic layer 32 which is magnetically connected to the first magnetic layer 31 with exchange interaction, so that a boundary magnetic wall can exist between the first magnetic layer and the second magnetic layer around a room temperature.

That is, according to the present example, the first magnetic layer 31 consists of two magnetic films, i.e., the reproduction layer 13 and the memory layer 14 which are formed with an identical sputter gas pressure, whereas the second magnetic layer 32 consists of four magnetic layers, i.e., the intermediate layer 15, the recording layer 16, the switch layer 17, and the initialization layer 18 which are formed with an identical sputter gas pressure. Moreover, the sputter gas pressure applied when forming the first magnetic layer 31 is set to a greater value than the sputter gas pressure employed when forming the second magnetic layer 32.

Note that the magneto-optical disk prepared according to this example will be referred to as Sample A in evaluation of the magneto-optical disk which will be given later.

EXAMPLE 2

According to a second example, the sputter gas pressure is set to 9 mTorr when forming the first magnetic layer, i.e., the reproduction layer 13 and the memory layer 14, and 7 mTorr when forming the second magnetic layer 32, i.e., the intermediate layer 15, the recording layer 16, the switch layer 17, and the initialization layer 18. Except for this, the same conditions as Example 1 are employed for forming a magneto-optical disk. The magneto-optical disk obtained according to this example will be referred to as Sample B in evaluation of the magneto-optical disk which will be given later.

COMPARATIVE EXAMPLE 1

In this comparative example, a magneto-optical disk having the configuration as shown in FIG. 2 is prepared under the same conditions as Embodiment 1 except for that the sputter gas pressure is set to 7 mTorr throughout the formation of all the magnetic layers. The magneto-optical disk thus prepared will be referred to as Sample C.

COMPARATIVE EXAMPLE 2

In this comparative example, a magneto-optical disk having the configuration as shown in FIG. 2 is prepared under the same conditions as Embodiment 1 except for that the sputter gas pressure is set to 11 mTorr throughout the formation of all the magnetic layers. The magneto-optical disk thus prepared will be referred to as Sample D.

EVALUATION OF THE SAMPLES

For the Samples A to D, recording and reproduction characteristics and reproduction durability were evaluated. The evaluation of the recording/reproduction characteristics was Carried out by using an evaluation apparatus having a laser beam wavelength of 680 nm and a numerical aperture NA of 0.55, so as to confirm the recording/reproduction characteristics and the overwriting characteristics. The evaluation of the reproduction durability was carried out by obtaining S/N values after repeating reproduction with various reproduction powers. That is, a signal of a single frequency of a mark length 0.64 μm at a linear velocity 9.4 m/s was recorded and the noise of 0 to 14 MHz was integrated. For each of the reproduction powers, the number of repetition was determined when the S/N has become 19 dB.

EVALUATION OF RECORDING/ REPRODUCTION CHARACTERISTICS

As a result of the aforementioned checks of the recording/reproduction characteristics, it was found that Sample A, Sample B, and Sample C operated normally and had almost identical signal characteristics such as S/N, but Sample D did not operate normally.

In order to find out the cause, further detailed checks were made, and it was found that Sample D had an inferior erase sensitivity which was almost identical to the recording sensitivity, and that erasing requires magnetization in the opposite direction to the recording direction. This results shows that Sample D has a problem that a boundary magnetic wall is formed between the recording layer 16 and the initialization layer 18 during an initialization process and the initialization cannot be Carried out normally.

In general, in the magneto-optical disk capable of Carrying out photo-intensity modulation direct overwriting, Formula (3) given below should be satisfied in order that the recording layer 16 is initialized and the initialization process is Carried out normally $$2 \cdot Ms(W) \cdot Hc(W) \cdot h(W) < \sigma w(Sw) - \sigma w(Int) \quad (3)$$

In this Formula (3), Hc(W) represents the coercive force of the recording layer 16; Ms(W), saturation magnetization of the recording layer 16; h(W), film thickness of the recording layer 16; σw(Sw), boundary magnetic wall energy in the boundary between the recording layer 16 and the switch layer 17; and σw(Int), boundary magnetic wall energy in the boundary between the memory layer 14 and the intermediate layer 15.

As can be seen from the Formula (3) above, in order to carry out the initialization process normally, the MsHc product of the recording layer should be sufficiently small. However, in a case of Sample D in which all the magnetic layers are formed with the same sputter gas pressure set to 11 mTorr, not only the MsHc product of the memory layer 14 but the MsHc product of the recording layer 16 is also increased. For this, Sample D cannot satisfy the Formula (3) above and cannot carry out the initialization process normally.

EVALUATION OF THE REPRODUCTION DURABILITY

Figure 3:
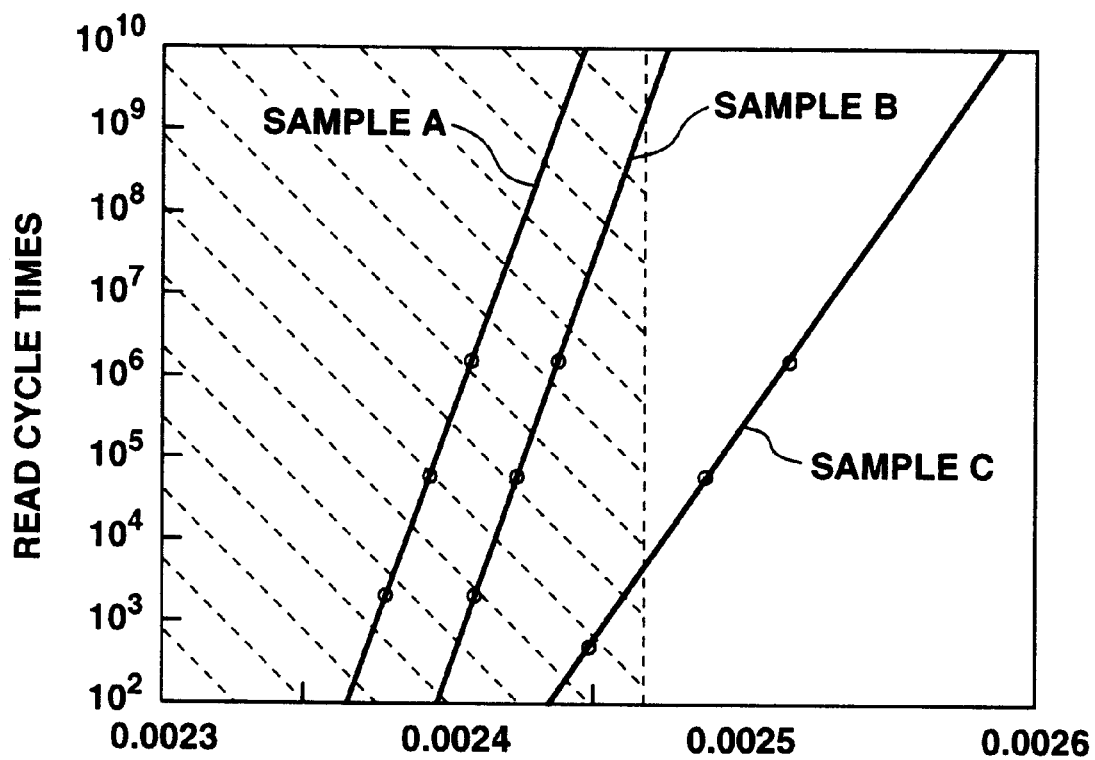
FIG. 3 shows results of durability tests of Samples A, B, and C.

Sample A, Sample B, and Sample C having almost identical initialization characteristics were further checked for their reproduction durability. FIG. 3 shows the result of this check. In FIG. 3, a portion shaded by slanting lines is a region where repeated reproduction is enabled with a reproduction power of 1.5 mW in the ambient temperature of 55° C.

As shown in FIG. 3, Sample A can repeat reproduction $10^{10}$ times or above and Sample B can repeat reproduction $10^9$ times or above, but Sample C can repeat reproduction only $10^4$ times or so. This result shows that controlling the sputter gas pressures as in Example 1 and Example 2 significantly increases the durability against repeated reproduction.

Note that in the aforementioned Example 1 and Example 2, a constant gas pressure is applied for forming the first magnetic layer 31 consisting of the reproduction layer 13 and the memory layer 14 and another constant gas pressure is applied for forming the second magnetic layer 32 consisting of the recording layer 16, the switch layer 17, and the initialization layer 18.

However, since the main problem is the boundary magnetic wall energy between the first magnetic layer 31 and the second magnetic layer 32 from the viewpoint of stability of the recording magnetic domain, it is possible to change the sputter gas pressure for film formation of only the magnetic layers positioned in the boundary between the first magnetic layer 31 and the second magnetic layer 32.

That is, for example, it is possible to increase the sputter gas pressure when forming the memory layer 14 of the first magnetic layer 31 or reducing the gas pressure when forming the intermediate layer 15 of the second magnetic layer 32. Alternatively, it is also possible to increase sputter gas pressure when forming the memory layer 14 and to lower the sputter gas pressure when forming the intermediate layer 15 while applying a constant sputter gas pressure for all the other magnetic layers.

However, from the viewpoint of productivity it is not preferable to change the sputter gas pressure so often while forming a plurality of magnetic layers. Practically, as in Example 1 and Example 2, it is preferable to apply a constant sputter gas pressure for the first magnetic layer 31 consisting of the reproduction layer 13 and the memory layer 14 and another constant sputter gas pressure for the second magnetic layer 32 consisting of the intermediate layer 15, the recording layer 16, the switch layer 17, and the initialization layer 18.

Explanation has been given on the photo-magnetic disk having six layers, but this number of layers is not essential to the present invention, which can also be applied to a magneto-optical disk having no reproduction layer 13 or no intermediate layer 15. That is, the present invention can be applied to a 4-layered configuration consisting of the memory layer 14, the recording layer 16, the switch layer 17, and the initialization layer 18; a 5-layered configuration consisting of the reproduction layer 13, the memory layer 14, the recording layer 16, the switch layer 17, and the initialization layer 18; or a 5-layered configuration consisting of the memory layer 14, the intermediate layer 15, the recording layer 16, the switch layer 17, and the initialization layer 18.

Moreover, the present invention can also be applied to a magneto-optical disk other than those capable of the photo-intensity modulation direct overwriting. That is, the present invention can be applied to a wide range of the magneto-optical recording medium having a first magnetic layer consisting of one or more than one magnetic films which are magnetized in a predetermined direction according to a data signal and a second magnetic layer consisting of one or more than one magnetic films magnetically connected to the first magnetic layer by exchange interaction so that a boundary magnetic wall can exist between the first magnetic layer and the second magnetic layer around a room temperature.

More specifically, the present invention can be applied when producing a magneto-optical disk using the magnetic super resolution (MSR) technique.

The magnetic super resolution is a technique to produce a mark recorded with a pitch smaller than a beam spot diameter, by devising a recording film of the magneto-optical disk. In general, when a laser beam is applied, the backward portion of the beam spot has a higher temperature the front portion of the beam spot. Consequently, it is possible to magnetically cover a part of the beam spot by forming a layer on a recording film, so as to serve as a magnetic mask according to a temperature difference. Thus, by forming a layer which serves as a magnetic mask according to a temperature difference, it is possible to limit an area where a signal is detected, enabling to reproduce a smaller recorded mark. This is the magnetic super resolution technique.

In a magneto-optical disk using such magnetic super resolution technique, it is necessary to form a layer which serves as a magnetic mask according to a temperature difference and a layer where a data signal is actually recorded, between which layers there can exist a boundary magnetic wall around a room temperature. By applying the present invention when producing a magneto-optical disk using the magnetic super resolution technique, it is possible to provide a stable boundary magnetic wall between a layer serving as the magnetic mask according to a temperature difference and a layer where a data signal is actually recorded.

As can be understood from the above explanation, the present invention changes the sputter gas pressure for forming magnetic layers so as to control the MsHc product of the magnetic layers, thus enabling to form a stable boundary magnetic wall between the magnetic layers. Consequently, the present invention can provide a magneto-optical recording medium having an excellent reproduction durability and an excellent durability for repeated recording.

Moreover, by applying the present invention to production of a magneto-optical disk capable of the photo-intensity modulation direct overwriting, it is possible to provide a magneto-optical disk which simultaneously realizes the excellent function of the photo-intensity modulation direct overwriting and a high reliability similar to the level of the conventional magneto-optical disk incapable of the photo-intensity modulation direct overwriting.

Furthermore, by applying the present invention, it is possible to increase the margin of the reproduction durability and other characteristics, allowing some changes in the erase sensitivity due to irregularities during a magnetic layer formation. That is, the present invention can increase the practical production margin.

What is claimed is:

1. A method for producing a magneto-optical recording medium, the method comprising the steps of:

sputtering a first magnetic layer onto a substrate in the form of at least one magnetic film as a sub-layer which is magnetized in a predetermined direction according to a data signal; and sputtering a second magnetic film onto the first magnetic layer in the form of at least one magnetic film as a sub-layer which is magnetically connected to said first magnetic layer by an exchange interaction, so that a boundary magnetic wall exists between said first magnetic layer and said second magnetic layer at room temperature, wherein, at least a magnetic film of the magnetic films composing said first magnetic layer which is adjacent to said second magnetic layer is formed with a higher sputter gas pressure than a sputter gas pressure applied when forming a magnetic film of the magnetic films composing said second magnetic layer which is adjacent to said first magnetic layer to thereby impart stability to the boundary magnetic wall in which magnetic inversion of a recording domain in the first magnetic layer is essentially temperature independent at room temperature.

2. A method for producing a magneto-optical recording medium as claimed in claim 1, wherein said first magnetic layer is made from a plurality of magnetic films which are formed with an almost identical sputter gas pressure.

3. A method for producing a magneto-optical recording medium as claimed in claim 1, wherein said second magnetic layer is made from a plurality of magnetic films which are formed with an almost identical sputter gas pressure.

4. A method for producing a magneto-optical recording medium as claimed in claim 1, wherein said first magnetic layer consists of at least a first magnetic film which is adjacent to said second magnetic layer and a second magnetic film which provides a greater Kerr rotational angle than said first magnetic film.

5. A method for producing a magneto-optical recording medium as claimed in claim 1, wherein said second magnetic layer consists of at least a magnetic film which temporarily changes its magnetization direction according to a recording signal during a recording; a magnetic film which is temporarily demagnetized during a recording; and a magnetic film which does not change its magnetization direction during a recording.

6. The method of claim 1, wherein the first magnetic layer comprises a reproduction sub-layer and a memory sub-layer.

7. The method of claim 1, wherein the first magnetic layer comprises a memory sub-layer.

8. The method of claim 1, wherein the second magnetic layer comprises, in order, an initialization sub-layer, a switch sub-layer, and a recording sub-layer.

9. The method of claim 8, wherein the second magnetic layer further comprises an intermediate sub-layer between the recording sub-layer and the first magnetic layer.

10. The method of claim 1, wherein all of the magnetic films of the first and second magnetic layers are formed successively without breaking a vacuum of a sputtering apparatus.

11. The method of claim 1, comprising the further steps of forming a dielectric layer over the second magnetic layer and forming a metal layer over the dielectric layer.

* * * * *